United States Patent [19]

Keller

[11] Patent Number: 5,221,596
[45] Date of Patent: Jun. 22, 1993

[54] METHOD OF FORMING A RETROGRADE PHOTORESIST PROFILE

[75] Inventor: Gerald A. Keller, Chandler, Ariz.

[73] Assignee: Motorola, Inc., Schaumburg, Ill.

[21] Appl. No.: 753,461

[22] Filed: Sep. 3, 1991

[51] Int. Cl.[5] .............................................. G03C 5/00
[52] U.S. Cl. ................... 430/324; 430/326; 430/327; 430/329; 430/330
[58] Field of Search ............... 430/323, 324, 325, 326, 430/327, 329, 330

[56] References Cited

U.S. PATENT DOCUMENTS

| | | | |
|---|---|---|---|
| 4,212,935 | 7/1980 | Canavello | 430/326 |
| 4,536,421 | 8/1985 | Matsuzawa | 430/326 |
| 5,024,896 | 6/1991 | Mathad | 430/312 |

Primary Examiner—Marion E. McCamish
Assistant Examiner—Kathleen Duda
Attorney, Agent, or Firm—Joe E. Barbee

[57] ABSTRACT

A retrograde profile is formed in a photoresist layer (11, 20) by modifying the rate at which a photoresist developer solution dissolves a portion (12) of a photoresist layer (11, 20). The photoresist layer (11, 20) is exposed to a chemical such as hexamethyldisilizane or dimethylsulfoxane to allow a portion (12) of the photoresist (11, 20) to absorb the chemical. The photoresist (11, 20) is then heated in order to enhance a reaction between the photoresist (11, 20) and the chemical. The reaction modifies a portion (12) of the photoresist (11, 20) to reduce the rate at which the portion (12) of the photoresist (11, 20) is dissolved by a developer solution.

16 Claims, 1 Drawing Sheet

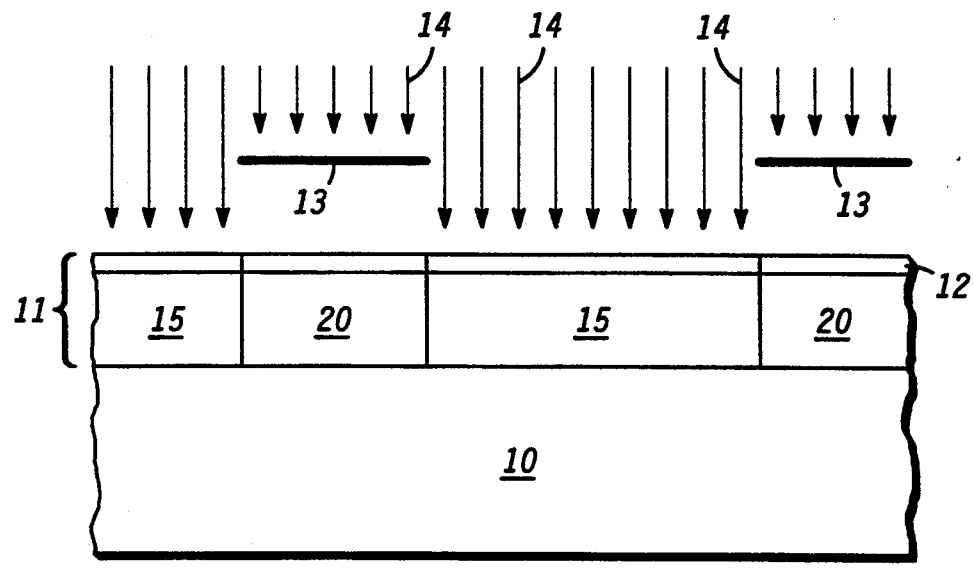
*FIG. 1*
*FIG. 2*
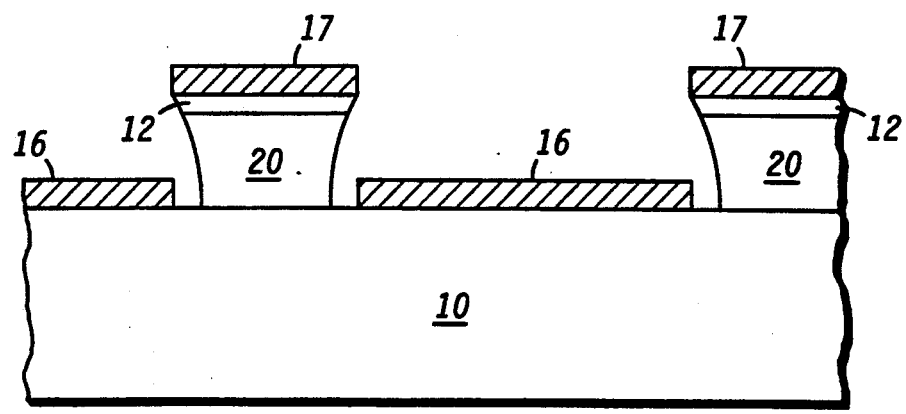

METHOD OF FORMING A RETROGRADE PHOTORESIST PROFILE

BACKGROUND OF THE INVENTION

The present invention relates, in general, to semiconductors, and more particularly, to semiconductor processing methods.

In the past, the semiconductor industry had used photolithography lift-off techniques to form conductor patterns on semiconductor wafers. These previous lift-off techniques used solvents such as chlorobenzene to alter the reaction between a photoresist and a photoresist developer solution in order to form an undercut or retrograde profile on the sidewalls of the photoresist. Chlorobenzene, the typical solvent used to modify the reaction between the developer solution and the photoresist, was considered to be a hazardous material. Consequently, use of such hazardous materials required special handling precautions during manufacturing and required special disposal methods.

In addition, the previous lift-off techniques, which used solvents such as chlorobenzene, often did not produce a smooth retrograde profile. That is, portions of the photoresist's sidewall had rough sections or ridges. These rough areas provided a bridge that allowed the conductor material that was to be lifted-off the semiconductor wafer to be attached to the conductor material that was to remain on the wafer. Consequently, lifting-off the unwanted conductor material often resulted in disturbing the desired conductor material that was to be left on the wafer.

Accordingly, it is desirable to have a metal lift-off technique that does not use hazardous materials such as chlorobenzene, that forms a smooth retrograde profile in the photoresist, and that facilitates removing undesirable conductor material without disturbing the desired conductor material.

SUMMARY OF THE INVENTION

Briefly stated, the present invention includes modifying the rate at which a photoresist developer solution dissolves a portion of a photoresist layer. The photoresist layer is exposed to a chemical such as hexamethyldisilizane or dimethylsulfoxane to allow a portion of the photoresist to absorb the chemical. The photoresist is then heated in order to enhance a reaction between the photoresist and the chemical. The reaction modifies a portion of the photoresist to reduce the rate at which the portion of the photoresist is dissolved by a developer solution.

BRIEF DESCRIPTION OF THE DRAWINGS

FIG. 1 is an enlarged cross sectional portion of a semiconductor substrate in accordance with the present invention; and FIG. 2 is the substrate of FIG. 1 at a stage of a lift-off procedure in accordance with the present invention.

DETAILED DESCRIPTION OF THE DRAWINGS

FIG. 1 illustrates a portion of a semiconductor substrate 10 which may contain a plurality of transistors and passive elements that are to be interconnected with a conductor pattern. The conductor pattern will be applied to substrate 10 by using a lift-off technique that employs a conventional positive photoresist layer 11. In order to facilitate the lift-off procedure, the top layer of photoresist 11 is chemically modified to alter the top layer's reaction rate with a conventional photoresist developer solution. Then, photoresist 11 is patterned using standard photolithography techniques that are well known to those skilled in the semiconductor art. While patterning the photoresist, the sidewalls of the photoresist slowly react with the photoresist developer so that a portion of the sidewalls are dissolved. This dissolving of the sidewalls provides the desired retrograde sidewall pattern on photoresist 11 as will be seen hereinafter.

Typically, photoresist 11 includes a phenolic resin matrix material, a diazo ketone sensitizer, and a solvent that binds the resin and sensitizer together. Such photoresists are well known to those skilled in the semiconductor art. In the preferred embodiment, photoresist 11 includes a novolak resin although a phenolformaldehyde resin could also be used. Photoresist 11 is applied to substrate 10 using conventional photoresist application techniques that are well known to those skilled in the semiconductor art.

Chemically modifying a portion of photoresist 11 is a procedure that includes exposing photoresist 11 to hexamethyldisilizane $((CH_3)_3SiNHSi(CH_3)_3)$, commonly referred to as HMDS, so that the HMDS may soak into photoresist 11, then heating photoresist 11 to enhance a reaction between the photoresist resin and the HMDS. HMDS is an organosilane that has an affinity for the photoresist resin. It is believed that the silicon atoms of HMDS form a silicon-oxygen bond to an available oxygen atom of the photoresist resin. As a result, HMDS reacts with the top layer of photoresist 11 by splitting into two molecules of trimethylsilanol $((CH_3)_3Si)$ and ammonia $(NH_3)$. The silicon atom (Si) of each trimethylsilanol (TMS) molecule attaches to the available oxygen atom of the resist and forms a thin TMS layer 12 along the top of photoresist 11. TMS layer 12 has a much lower solubility in the photoresist developer than the remaining portions of photoresist 11. This lower solubility will be used to facilitate forming a retrograde profile pattern on photoresist 11 as will be seen hereinafter.

Photoresist 11 may be exposed to the HMDS by a variety of methods including, but not limited to, immersing substrate 10 and photoresist 11 in a beaker containing a sufficient amount of HMDS to cover photoresist 11. The exposure time should be sufficient to permit the HMDS to penetrate photoresist 11 to a predetermined depth. A depth between approximately 0.1 and 0.3 microns is generally sufficient to provide the desired retrograde sidewall profile. Typically, a soak time of between approximately four minutes and twenty minutes provides the desired depth. After removing substrate 10 from the HMDS, excess HMDS is rinsed from photoresist 11. Then, photoresist 11 is baked at a temperature between approximately eighty and one hundred twenty degrees centigrade for approximately twenty to thirty-five minutes in order to enhance the HMDS reaction with the photoresist resin thereby converting a portion of photoresist 11 to TMS layer 12.

In the preferred embodiment, photoresist 11 is exposed to the HMDS in a vacuum vapor prime oven, such as an LP-III that is manufactured by Yield Engineering Systems Inc. of San Jose, Calif. Such equipment is well known to those skilled in the semiconductor art. The vacuum vapor prime oven creates a vacuum sufficient to evaporate HMDS and create an HMDS vapor that surrounds photoresist 11 and substrate 10. In this preferred embodiment, photoresist 11 is exposed to the HMDS vapor for a period between approximately four minutes and twenty minutes. Subsequently, photoresist 11 is baked in the vacuum vapor prime oven at a temperature between approximately eighty and one hundred twenty degrees centigrade for approximately twenty to thirty-five minutes.

After the bake has been completed, photoresist 11 is patterned by conventional photolithography techniques that are well known to those skilled in the semiconductor art. During the photolithography procedure, actinic light is shown through a mask 13 to illuminate a portion of photoresist 11. In FIG. 1, the actinic light is represented by a series of arrows 14 which illustrate the actinic light passing through openings in mask 13 and forming photoresist 11 into sections of exposed photoresist 15 and unexposed photoresist 20. The actinic light converts exposed photoresist 15 into a material that is readily dissolved by a conventional chemical base developer solution, such as an aqueous solution of dilute sodium hydroxide (NaOH) containing a mixture of sodium meta-silicate and sodium phosphates. During this photolithography procedure, the actinic light is diffracted by the apertures of mask 13. The diffracted light extends a very short distance under the edges of mask 13 and exposes a small amount of the lower portion (closest to substrate 10) of unexposed photoresist 20. Those skilled in the semiconductor art commonly refer to such occurrences as overexposure. This overexposure is important and assists in forming a smooth retrograde photoresist profile.

FIG. 2 illustrates substrate 10 and unexposed photoresist 20 from FIG. 1 at a subsequent stage in the formation of a retrograde photoresist pattern. The elements of FIG. 2 that are the same as the elements of FIG. 1 have the same reference numerals. After the developer has dissolved exposed photoresist 15 (FIG. 1), the developer is left in contact with unexposed photoresist 20 to allow the developer to slowly dissolve portions of the sidewalls of unexposed photoresist 20. The portions of TMS layer 12 that cover unexposed photoresist 20, reacts with the developer at an even slower rate than unexposed photoresist 20. Consequently, a portion of the sidewalls of unexposed photoresist 20 are slightly dissolved while TMS layer 12 is not dissolved thereby undercutting TMS layer 12 and creating a retrograde profile on the sidewalls of unexposed photoresist 20. That is, the sides of unexposed photoresist 20 are not straight or perpendicular to substrate 10, but are wider in TMS layer 12 than in the lower portions of unexposed photoresist 20. This retrograde profile is the feature that facilitates the lift-off operation. Since the HMDS only affects the upper portion of photoresist 11 (see FIG. 1), the retrograde sidewalls of unexposed photoresist 20 are very smooth. This is a significant advantage over prior methods which used chlorobenzene to form the retrograde profiles, since the chlorobenzene did not smoothly remove the unexposed photoresist resin and resulted in rough sidewalls. It should be noted that other non-hazardous chemicals, such as dimethylsulfoxane, can also be used to provide the smooth retrograde profile.

Subsequent to the photolithography operation, conductor material is deposited to form a conductor pattern that includes a conductor 16 on the surface of substrate 10 and a conductor 17 on the surface of unexposed photoresist 20. As the conductor material is deposited, TMS layer 12 functions as a mask that prevents the conductor material from being deposited on the sidewalls of unexposed photoresist 20. Therefore, the retrograde sidewall profile ensures that conductor 16 is not connected to conductor 17. As a result, unexposed photoresist 20 can be dissolved in a solvent thereby floating or lifting-off conductor 17 and leaving conductor 16 on the surface of substrate 10. Typically, unexposed photoresist 20 and conductor 17 are removed by dissolving unexposed photoresist 20 in a solvent, such as acetone, ketone, or other solvents that are well known to those skilled in the semiconductor art. Retrograde photoresist profiles are useful in forming, among other things, ohmic contacts, interconnect patterns, gate metallizations, etc. in field effect transistors and bipolar transistors.

By now it should be appreciated that there has been provided a novel way to modify the rate at which a photoresist reacts with a developer solution. The modified reaction rate can be used to provide a variety of photoresist patterns on a variety of photoresist materials. Hexamethyldisilizane or dimethylsulfoxane can be used to modify the rate at which the developer solution dissolves the photoresist. The photoresist patterns formed from the use of hexamethyldisilizane and dimethylsulfoxane have smooth sidewalls which substantially prohibits conductor material from forming on the sidewalls, and facilitates a clean lift-off operation that does not disturb conductor material that is left on a semiconductor substrate.

I claim:

1. A method of forming a retrograde photoresist profile comprising:
   providing a semiconductor substrate;
   applying a photoresist having a novolac resin to the substrate;
   exposing the photoresist to hexamethyldisilizane for a predetermined time for forming a hexamethyldisilizane layer in the photoresist;
   heating the photoresist for enhancing a reaction between the novolac resin and the hexamethyldisilizane layer thereby forming a modified layer within the photoresist;
   applying a mask and exposing a first portion of the photoresist to actinic light while leaving a second portion of the photoresist unexposed;
   placing the photoresist in contact with a developing solution for dissolving the first portion of the photoresist thereby exposing a portion of the substrate and sidewalls of the second portion of the photoresist while leaving the second portion of the photoresist on the substrate, and dissolving a portion of the sidewalls underlying the modified layer thereby smoothing the sidewalls;
   removing the developing solution;
   depositing a conductor material to cover the exposed portion of the substrate and a top surface of the second portion of the photoresist; and
   removing the second portion of the photoresist and the conductor material on the second portion while leaving the conductor material that is on the substrate by placing the second portion of the photoresist in contact with a solvent.

2. The method of claim 1 wherein exposing the photoresist to hexamethyldisilizane includes placing the substrate into a beaker containing a sufficient quantity of the hexamethyldisilizane to cover the photoresist.

3. The method of claim 1 wherein exposing the photoresist to hexamethyldisilizane includes placing the substrate and the photoresist into a vacuum vapor prime oven that contains a quantity of hexamethyldisilizane, and developing a vacuum sufficient to produce a hexamethyldisilizane vapor so that the photoresist is in contact with the hexamethyldisilizane vapor.

4. The method of claim 1 wherein removing the second portion of the photoresist includes removing the second portion of the photoresist by placing the second portion of the photoresist in acetone.

5. A method of forming a photoresist having a retrograde profile comprising:
   exposing a photoresist layer having a phenolic resin matrix material to a chemical that is one of hexamethyldisilizane and dimethylsulfoxane for a predetermined time for the purpose of forming a layer of the chemical in the photoresist;
   heating the photoresist and the layer of the chemical thereby forming a chemically modified layer within the photoresist;
   exposing a portion of the photoresist layer to light; and
   treating the photoresist layer with a developer solution thereby dissolving the exposed portion of the photoresist layer and undercutting the modified layer of unexposed photoresist to form smooth sidewalls underlying the modified layer.

6. The method of claim 5 wherein exposing the photoresist layer having the phenolic resin matrix material to the chemical includes exposing the photoresist layer for a time between approximately four minutes and twenty minutes.

7. The method of claim 5 wherein treating the photoresist layer with the developer solution includes treating the photoresist layer with a base chemical.

8. The method claim 5 wherein exposing the photoresist layer having the phenolic resin matrix material includes exposing the photoresist layer containing a novolac resin.

9. The method of claim 5 wherein exposing the photoresist layer having the phenolic resin matrix material includes having a phenolformaldehyde resin matrix material.

10. The method of claim 5 wherein heating the photoresist includes baking the photoresist at a temperature between approximately 80 and 120 degrees centigrade for a time period between approximately twenty and thirty-five minutes.

11. A method of varying a reaction rate between a photoresist and a enveloper solution comprising:
    providing a photoresist having a phenolic resin matrix material;
    exposing the photoresist to a chemical that is one of hexamethyldisilizane and dimethylsulfoxane for a predetermined time for the purpose of forming a layer of the chemical in the photoresist; and
    heating the photoresist or enhancing a reaction between the chemical and the photoresist thereby forming a chemically modified layer within the photoresist.

12. The method of claim 11 wherein providing a photoresist includes providing the photoresist having a novolac resin.

13. The method of claim 11 wherein providing a photoresist includes providing the photoresist having a phenolformaldehyde resin.

14. The method of claim 11 wherein exposing the photoresist to the chemical includes placing the photoresist and a quantity of the chemical into a vacuum vapor prime oven and creating a vacuum sufficient to vaporize a portion of the chemical thereby creating a chemical vapor so that the photoresist is exposed to the chemical vapor.

15. The method of claim 11 wherein heating the photoresist includes heating the photoresist and the chemical to a temperature between approximately eighty degrees centigrade and one hundred twenty degrees centigrade for a time between approximately twenty and thirty-five minutes.

16. The method of claim 11 wherein exposing the photoresist to the chemical includes exposing the photoresist to the chemical for a time between approximately four minutes and twenty minutes.

* * * * *

UNITED STATES PATENT AND TRADEMARK OFFICE
CERTIFICATE OF CORRECTION

PATENT NO. : 5,221,596
DATED : June 22, 1993
INVENTOR(S) : Gerald A. Keller

It is certified that error appears in the above-indentified patent and that said Letters Patent is hereby corrected as shown below:

Column 6, claim 11, line 9, change "enveloper" to --developer--.

Column 6, claim 11, line 16, change "or" to --for--.

Signed and Sealed this

Eighth Day of November, 1994

Attest:

BRUCE LEHMAN

Attesting Officer     Commissioner of Patents and Trademarks